United States Patent [19]

Farquhar

[11] Patent Number: 5,792,375
[45] Date of Patent: Aug. 11, 1998

[54] METHOD FOR BONDING COPPER-CONTAINING SURFACES TOGETHER

[75] Inventor: Donald Seton Farquhar, Endicott, N.Y.

[73] Assignee: International Business Machines Corporation, Armonk, N.Y.

[21] Appl. No.: 808,520

[22] Filed: Feb. 28, 1997

[51] Int. Cl.[6] .................. B44C 1/22; C23F 1/00
[52] U.S. Cl. .................. 216/34; 216/20; 216/105
[58] Field of Search .................. 216/13, 20, 33, 216/34, 78, 105

[56] References Cited

U.S. PATENT DOCUMENTS

| | | | |
|---|---|---|---|
| 4,434,022 | 2/1984 | Kamada et al. | 216/20 X |
| 4,714,517 | 12/1987 | Malladi et al. | 216/34 |
| 4,788,766 | 12/1988 | Burger et al. | 29/830 |
| 4,898,275 | 2/1990 | Skrtic et al. | 206/330 |
| 5,038,996 | 8/1991 | Wilcox et al. | 228/121 |
| 5,046,238 | 9/1991 | Daigle et al. | 29/830 |
| 5,049,221 | 9/1991 | Wada et al. | 216/20 X |
| 5,359,767 | 11/1994 | Chen et al. | 29/830 |
| 5,374,344 | 12/1994 | Gall et al. | 205/96 |
| 5,421,507 | 6/1995 | Davis et al. | 228/194 |
| 5,439,164 | 8/1995 | Hasegawa et al. | 228/194 |
| 5,442,144 | 8/1995 | Chen et al. | 174/266 |

OTHER PUBLICATIONS

Nichting, R.A. et al, Low-Temperature Solid-State Bonding of Copper, *Journal of Materials Engineering and Performance* (1992) 1:35–44.

*Primary Examiner*—William Powell
*Attorney, Agent, or Firm*—Pollock, Vande Sande & Priddy

[57] ABSTRACT

Two copper containing surfaces are bonded together by microetching at least one of the surfaces, followed by abutting the two surfaces together, and then laminating them at a temperature of at least about 300° C. and below the decomposition temperature of the copper-containing surfaces, and at a pressure of at least about 1500 psi.

19 Claims, 2 Drawing Sheets

1

METHOD FOR BONDING COPPER-CONTAINING SURFACES TOGETHER

TECHNICAL FIELD

The present invention is concerned with bonding two copper containing surfaces together and is especially concerned with a method that does not require a flux and does not require employing an auxiliary metal coating, such as a noble or precious metal. The process of the present invention is especially suitable for bonding copper terminals on electronic components such as semi-conductor chips, semi-conductor chip carrying modules, surface mounted electronic devices, and the like, two copper pads on a second level electronic package, such as a printed circuit board or a printed circuit card. The present invention is especially suitable for fabricating multi-layer circuit boards, bonding of copper layer in a so-called "capping" process to an integrated circuit board, joining copper containing pads to copper containing pads, and joining copper containing pads to copper containing lands.

BACKGROUND ART

In many products and applications, it becomes necessary to bond two copper surfaces together. For instance, in the fabrication of current day electronic devices it is necessary to bond electrically conductive copper bonding pads together. The copper terminals on an electronic component, such as a semi-conductor chip, a semi-conductor chip carrying module or a surface mounted electronic device need to be bonded to a corresponding copper bonding pad on a second level electronic package, such as a printed circuit board or a printed circuit card.

Moreover, in certain applications for teflon-based circuit boards, it is desirable to join two cores of circuit boards together by means of lamination where both a mechanical and electrical connection are simultaneously achieved. This type of joining process eliminates the need for drilling and plating holes to make layer-to-layer interconnections, thus improving panel utilization. Multi-layer board fabrication is especially desirable when high wiring density is required or when blind or buried vias are necessary.

In another technique, referred to as "hybrid chip carrier," all of the vias (e.g., about 100,000) of a teflon-based circuit board are topped or capped with copper. The copper is present to preclude any polymer, such as the surrounding dielectric material, from seeping into the vias. This capping process employs the joining of the copper layer to the core as contrasted to the joining of two cores together.

All of these techniques require bonding of copper-to-copper. However, obtaining a tenacious copper-to-copper bond has not been possible for some applications without special processing techniques. For instance, the existing bonding processes employ a flux and soldering technique, or a plating process to deposit a layer of metal on the copper, such as a noble metal or an alloy capable of forming a eutectic. One widely used technique is referred to as the transient liquid phase technique. In a transient liquid phase joining technique, the two parts to be formed require a photoprocessing step, and then multiple steps of precious metal plating. After stripping the photoresist, the parts are typically treated with a black oxide surface preparation step, and then must be precisely aligned for joining. After this, a complicated press cycle is required where the temperature is controlled precisely to achieve the desired metallurgical bond and polymer fusion conditions.

The bonding of copper layers together is made more difficult because of the tendency of copper to oxidize,

2 especially at high temperatures. Furthermore, bonding of copper-to-copper in structures containing dielectric polymeric materials precludes the ability to employ temperatures above the melting point of copper, since such temperatures would destroy the polymeric substrates.

Therefore, although techniques have been devised in the prior art to achieve such bonding, there exists room for improvement.

SUMMARY OF THE INVENTION

The present invention provides a method for bonding two copper or copper alloy surfaces together that is capable of achieving a tenacious bond, and does not require use of flux compositions or metal coatings on the copper, such as eutectic forming materials and noble metals, such as gold, silver, platinum, palladium and rhodium as employed in prior art techniques. The method of the present invention surprisingly results in achieving a tenacious copper-to-copper bond without such added materials and without employing temperatures at or above the melting point of the copper containing surfaces.

More particularly, the method of the present invention includes microetching, at least one of the copper or copper alloy surfaces, and then abutting the copper or copper alloy surfaces together. The method then involves laminating the two copper or copper alloy surfaces together at a temperature of at least about 300° C., and below the melting point of copper, and at a pressure of at least about 1500 psi.

The present invention is also concerned with the structure obtained by the above described process.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DESCRIPTION OF BEST AND VARIOUS MODES FOR CARRYING OUT INVENTION

Figure 1:
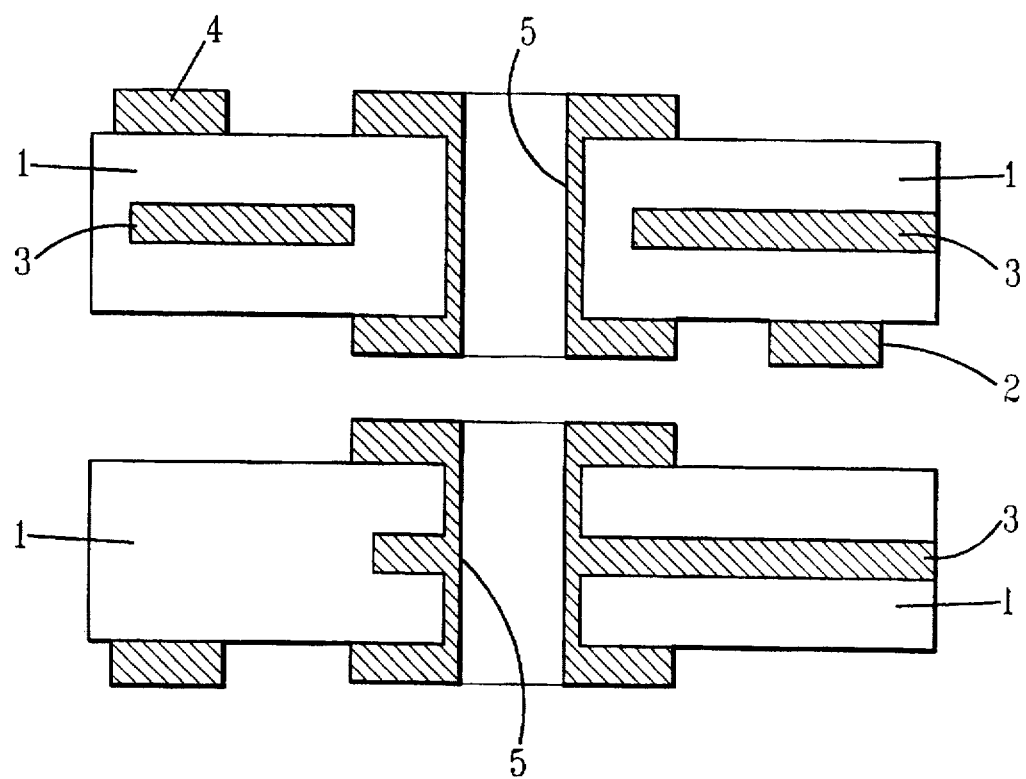
FIG. 1 is a schematic illustration of two circuit boards in an alignment prior to joining them in accordance with the process of the present invention.

The bonding or joining method of the present invention can be applied to contacting metal surfaces of pure copper and more specifically, electronic grade copper. Electronic grade copper is typically electroplated, and is 100% pure except for any impurities that may result from plating. The external surface may have oxides, impurities or coatings, but it is the intent of this invention to remove these from the surface. According to the present invention, the structures preferably subjected to the bonding process include a dielectric substrate, such as those typically employed in circuit board fabrication. The dielectric substrate must have a laminating temperature close to the temperature employed in the process of the present invention. Suitable polymeric materials are the fluorinated polymeric materials. Such are well-known and include such commercially available polyfluoroalkylene materials as polytetrafluoroethylene, copolymers of tetrafluoroethylene and hexafluoropropylene, copolymers of tetrafluoroethylene and perfluoro-2-2-dimethyl-1-3 dioxide, polytrifluorochloroethylene, copolymers of tetrafluoroethylene with for example olefins such as ethylene; copolymers of tetrifluoromonochloroethylene with for example, olefins such as ethylene, and polymers of perfluoroalkylvinylether.

Some commercially available fluorinated polymeric materials employed pursuant to the present invention include those available under the trade designation TEFLON PTFE (polymers of tetrafluoroethylene) TEFLON FEP (perfluorinated ethylene-propylene copolymers); TEFLON PFA (copolymer of tetrafluoroethylene and perfluoroalkoxy); TEFZEL (copolymer of tetrafluoroethylene and ethylene): HALAR (copolymer of chlorotrifluoroethylene and ethylene); KEL-F (polymer of chlorotrifluoroethylene); HBF-430 (polymer of chlorotrifluoroethylene) and TEFLON AF (copolymer of tetrafluoroethylene and at least 65 mol % of perfluoro-2,2-dimethyl-1,3 dioxide). The preferred fluorinated polymeric material is polytetrafluoroethylene (e.g., TEFLON).

The dielectric substrates can also include fillers such as silica and/or quartz used for reinforcement. For example, see U.S. Pat. No. 5,055,342, commonly owned by the present Assignee, disclosure of which is incorporated herein by reference. Also, reinforced Teflon dielectrics are commercially available, such as Rogers 2800 from Rogers Corporation. A wide variety of other fiber and/or particles reinforced dielectric materials are commercially available.

In printed circuit board fabrication, microetching refers to a wet copper etching process in which the copper removal rate is on the order of 1 micron per minute, as opposed to the bulk etching rates of 10 to 20 microns per minute that are typically used for forming circuit features in copper. The purpose of microetching as it pertains to this invention is to remove oxides, impurities, or coatings on the copper surface. Suitable microetchants include hydrogen peroxide, cupric chloride, ferric chloride and sodium persulfate, of which sodium persulfate is the preferred choice. Typical bath conditions for sodium persulfate etching are 90 to 130 gm/l sodium persulfate with 1 to 3 percent volume sulfuric acid at ambient temperature. Removal of a minimum of about 1 micron of copper is required to ensure a clean surface, corresponding to a minimum of about 1 minute in the etchant.

After treatment in the microetching composition, the structures can be subjected to a wash with deionized water in order to remove any excess etchant that remains, and moisture by baking for example above 100° C. up to about 200° C., typically about 125° C. to about 200° C., an example being 125° C. for up to 2 hours. Removing the moisture is important in circuit board manufacturing. Lamination within 8 hours of microetching is preferred to limit oxide growth and contamination of the copper.

Next, the copper surfaces are brought together or abutted and then laminated. The joining or laminating required by the present invention employs temperatures of at least about 300° C. but below the melting point of the copper and the decomposition temperature of the dielectric, when present. Lamination is performed under vacuum, or in a nitrogen environment. The laminating is carried out preferably at temperatures of about 300° C. to about 400° C., and most preferably at about 365° C. to about 385° C. a typical example being about 375° C. The pressure employed for the laminating is at least 1500 psi, preferably about 1500 to about 2500 psi, and most preferably about 1500 to about 2000 psi.

The laminating time at peak temperature usually takes about 30 to about 150 minutes, preferably about 45 to about 90 minutes, an example of which is about 90 minutes. The bond strength of copper-to-copper bonds achieved following the technique of the present invention is typically about 30 to about 35 pounds/inch. On the other hand, employing temperatures and pressures outside of the range required by the present invention, such as using about 200° C. and 1000 psi results in insufficient and poor adhesion.

The various processing steps are typically carried out in different chambers conveying the devices from one station to a subsequent processing station.

Figure 2A:
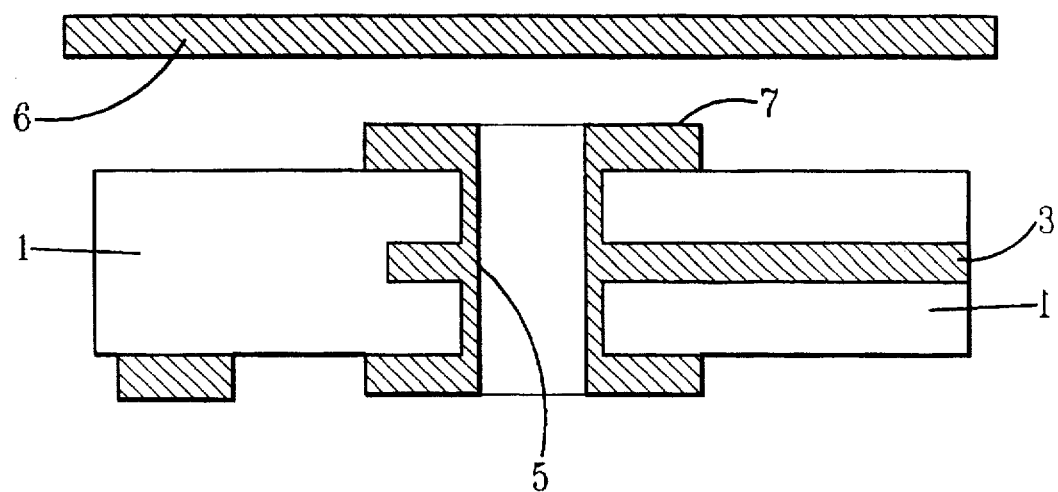
FIG. 2a is a schematic illustration of a circuit board aligned with a copper containing cap layer prior to joining pursuant to the process of the present invention.
Figure 2B:
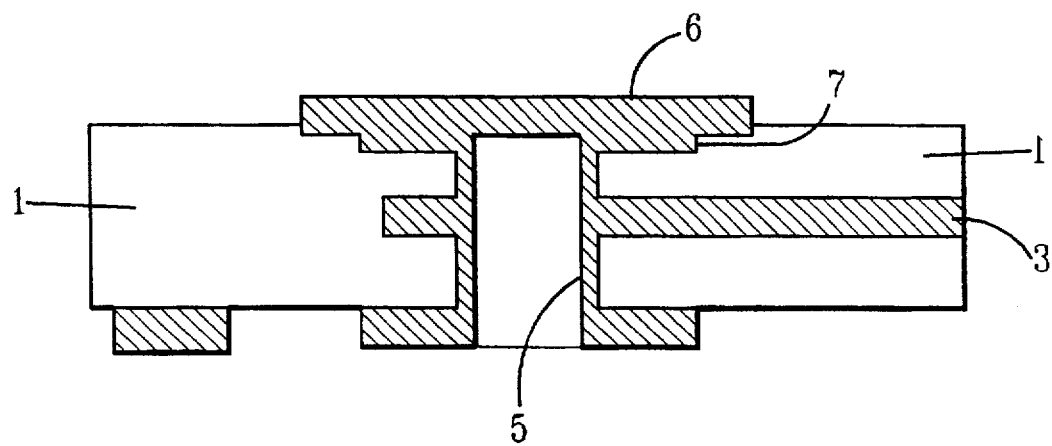
FIG. 2b is a schematic illustration of the structure after the cap is joined and photoprocessed.

FIG. 1 is a schematic diagram illustrating two circuit boards in alignment prior to being bonded or joined pursuant to the present invention. In particular, numeral 1 represents polytetrafluoroethylene based dielectric substrates, numeral 2 represents buried circuit lines, numeral 3 represents internal circuit lines, numeral 4 represents external circuit lines and numeral 5 represents plated through holes. FIGS. 2a represent a circuit board roughly aligned with a copper cap layer 6. Numeral 1 represents the dielectric material. Numeral 3 represents internal circuit line, numeral 5 plated through hole and numeral 7 copper plated lands. FIG. 2b is a schematic illustration of the structure after joining the copper cap 6 to the copper plated land 7 and photoprocessing to remove copper from undesired portions on top of the circuit board.

The following non-limiting examples are presented to further illustrate the present invention.

EXAMPLE 1

Two circuit boards of the configuration illustrated in FIG. 1 are prepared employing well-known usual processes, whereby the dielectric is teflon. The top layer circuitry includes copper circuit lines and copper pads. The two boards are then treated by microetching in a 100 gm/l sodium persulfate aqueous solution at a temperature of about 20° C. for about 1 minute. After the microetching, the two boards are aligned so that the copper pads coincide with each other during laminated with no dielectric material present between the two layers, as illustrated in FIG. 1. The arrangement is then laminated at a temperature of about 375° C. and a pressure of about 2000 psi for about 90 minutes. The copper-to-cooper bond achieved is characterized by peel tests as having 30 to 35 pounds/inch. The peel test is performed by pulling apart at 180° two layers of copper bonded together. The specimen width is 1 inch and the pull rate is 0.5 inch per minute.

EXAMPLE 2

A teflon/copper circuit board of the type illustrated in FIG. 2a is prepared employing standard techniques. The circuit board has a top surface containing copper pads that are electrically connected to subsurface layers through plated through holes. The copper pads and the copper capping material are microetched employing a 100 gm/l sodium persulfate aqueous solution. The copper capping layer is abutted the copper pads with no dielectric material between them as illustrated in FIG. 2a. The structure is then laminated at a temperature of about 365° C. and a pressure of about 2000 psi for about 90 minutes. The device is then subjected to photolithography and etching in order to remove portions of the top layer of copper, except in those areas where the copper cap is to remain. Peel tests on the copper-to-copper bond show about 30 to 35 pounds/inch.

The above examples illustrate the excellent bond strength that is surprisingly achieved by the present invention, and as discussed above, eliminates many steps required by prior art bonding techniques. For instance, in prior art transient liquid phase joining techniques, both parts to be joined require a photoprocessing step, and then multiple steps of precious metal plating. After stripping the resist, the parts are treated with chloride, and then must be precisely aligned for joining. Finally, a complicated press cycle is then required where the temperature is stepped precisely to achieve the desired metallurgical bond. The present invention achieves the necessary metallurgical bond without requiring such time consuming, expensive and sometimes difficult to carry out steps.

In this disclosure, there are shown and described only the preferred embodiments of the invention, but, as aforementioned it is to be understood invention is capable of use in various other combinations and environments and is capable of changes or modifications within the scope of the inventive concept as expressed herein.

What is claimed is:

1. A method for bonding two copper or copper alloy surfaces together which comprises:

microetching at least one of said copper surfaces;

abutting the two copper surfaces together;

and then laminating the two copper surfaces at a temperature of at least about 300° C. and below the melting point of copper, and at a pressure of at least about 1500 psi.

2. The method of claim 1 wherein said surfaces are copper surfaces.

3. The method of claim 1 wherein both of said surfaces are microetched.

4. The method of claim 1 wherein the temperature of the laminating is about 300° C. to about 400° C.

5. The method of claim 1 wherein the laminating is at a temperature of about 365° to about 385° C.

6. The method of claim 1 wherein the laminating is carried out at a temperature of about 375° C.

7. The method of claim 1 wherein the pressure is about 1500 psi to about 2500 psi.

8. The method of claim 1 wherein the pressure is about 1500 to about 2000 psi.

9. The method of claim 1 wherein the pressure is about 2000 psi.

10. The method of claim 1 wherein the laminating is carried out in about 30 to about 150 minutes.

11. The method of claim 1 being carried out in the absence of flux and auxiliary metal on the copper surfaces.

12. The method of claim 1 wherein at least one of said copper surfaces is provided on a dielectric substrate having a melting point below the melting point employed in the laminating.

13. The method of claim 12 wherein said dielectric substrate is based upon a fluorinated polymeric material.

14. The method of claim 13 wherein said fluorinated material is polytetrafluoroethylene.

15. The method of claim 14 wherein the laminating is carried out at a temperature of about 365° to about 385° C., and a pressure of about 1500 to about 2000 psi.

16. The method of claim 1 wherein a plurality of circuit boards are bonded together.

17. The method of claim 1 for bonding a copper cap layer to a circuit board.

18. Bonded copper surfaces obtained by the method of claim 1.

19. Bonded copper surfaces obtained by the method of claim 15.

* * * * *